(12) United States Patent
Su et al.

(10) Patent No.: US 7,655,954 B2
(45) Date of Patent: Feb. 2, 2010

(54) ARRAY TYPE LIGHT-EMITTING DEVICE WITH HIGH COLOR RENDERING INDEX

(75) Inventors: Chih-Liang Su, Jhonghe (TW); Hsin-Chun Liu, Sanchong (TW); Fang-Po Wang, Yonghe (TW)

(73) Assignee: Ledtech Electronics Corp., Taipei County (TW)

( * ) Notice: Subject to any disclaimer, the term of this patent is extended or adjusted under 35 U.S.C. 154(b) by 20 days.

(21) Appl. No.: 12/000,688

(22) Filed: Dec. 17, 2007

(65) Prior Publication Data

US 2009/0152572 A1   Jun. 18, 2009

(51) Int. Cl.
*H01L 33/00* (2006.01)
(52) U.S. Cl. .............................. 257/89; 257/79; 257/88; 257/98; 257/103; 257/E33.067
(58) Field of Classification Search .................. 257/88, 257/89, 79, 98, 103, E33.061, E33.067
See application file for complete search history.

(56) References Cited

U.S. PATENT DOCUMENTS

| | | | |
|---|---|---|---|
| 6,942,360 B2 * | 9/2005 | Chou et al. | 362/238 |
| 2003/0178627 A1 * | 9/2003 | Marchl et al. | 257/80 |
| 2003/0189829 A1 * | 10/2003 | Shimizu et al. | 362/240 |
| 2004/0000867 A1 * | 1/2004 | Chen | 313/512 |
| 2004/0218387 A1 * | 11/2004 | Gerlach | 362/231 |
| 2006/0197006 A1 * | 9/2006 | Kochi | 250/208.1 |
| 2006/0239002 A1 * | 10/2006 | Chou et al. | 362/249 |
| 2007/0223219 A1 * | 9/2007 | Medendorp et al. | 362/231 |
| 2008/0029772 A1 * | 2/2008 | Chiang | 257/88 |
| 2009/0033604 A1 * | 2/2009 | Silzars et al. | 345/84 |

* cited by examiner

*Primary Examiner*—Thanh V Pham
*Assistant Examiner*—Duy T Nguyen
(74) *Attorney, Agent, or Firm*—Rosenberg, Klein & Lee

(57) ABSTRACT

An array type light-emitting module includes a blue, a red, a green, a yellow and an amber light-emitting chip sets. Wavelength-converting layer set covers the blue light-emitting chip set. Transparent layer sets cover the red, green, yellow, and amber light-emitting chip sets. A portion of the visible light emitted by the blue light-emitting chip set is converted into visible light with another emission peak wavelength range via the wavelength-converting layer set. The converted visible light mixes with light projected from the red, the green, the yellow and the amber light-emitting chip sets to generate white light with a color rendering index ranging between 90 and 96.

20 Claims, 11 Drawing Sheets

| B+P(OG) | B+P(OG) | B+P(OG) | B+P(OG) |
|---------|---------|---------|---------|
| A       | G       | Y       | G       |
| G       | R       | G       | R       |
| B+P(OG) | B+P(OG) | B+P(OG) | B+P(OG) |

FIG. 5A

| B+P(OG) | B+P(OG) | B+P(G) | B+P(OG) |
|---|---|---|---|
| A | G | Y | G |
| G | R | G | R |
| B+P(OG) | B+P(G) | B+P(OG) | B+P(OG) |

FIG. 6A

| B+P(OG) | B+P(OG) | B+P(OG) | B+P(OG) |
|---------|---------|---------|---------|
| A | G | Y | G |
| G | R | G | A |
| B+P(OG) | B+P(OG) | B+P(OG) | B+P(OG) |

FIG. 7A

ARRAY TYPE LIGHT-EMITTING DEVICE WITH HIGH COLOR RENDERING INDEX

BACKGROUND OF THE INVENTION

1. Field of the Invention

The present invention relates to a light-emitting device, and particularly relates to an array type light-emitting device with high color rendering index.

2. Description of the Related Art

LED (light emitting diode) is a semiconductor component. It has a small size, and its advantage is that it can efficiently generate colored light with a peak wavelength corresponding to a single color. If light of different colors emitted by many LEDs is mixed, a white light source can be obtained.

For example, three LEDs such as a red LED, a green LED and a blue LED, generating light of three different wavelengths in the visible range can be combined together. Because each LED is a light source with a distinct peak wavelength and a single color, the white light source resulting from mixing the three different wavelengths is always non-uniform.

It is a priority for designers to design a semiconductor light-emitting device with high color rendering index (CRI). However, the traditional mixing method of using many LEDs (such as red LED, green LED, blue LED) with different peak wavelengths to generate white light can only obtain a color rendering index of about 80, and the generated white light is non-uniform.

SUMMARY OF THE INVENTION

One particular aspect of the present invention is to provide an array type light-emitting device with high color rendering index. The array type light-emitting device is composed of a blue light-emitting chip set that is covered by a wavelength-converting layer set, a red light-emitting chip set that is covered by a transparent layer set, a green light-emitting chip set that is covered by a transparent layer set, a yellow light-emitting chip set that is covered by a transparent layer set, and an amber light-emitting chip set that is covered by a transparent layer set. Hence, projected light emitted by the light-emitting chip sets are mixed each other to make the array type light-emitting device generate white light with a high color rendering index.

In order to achieve the above-mentioned aspects, the present invention provides an array type light-emitting device with high color rendering index, including: a substrate, an array type light-emitting module, a wavelength-converting layer set, and a plurality of transparent layer sets.

The array type light-emitting module is electrically disposed on the substrate. The array type light-emitting module is composed of a blue light-emitting chip set, a red light-emitting chip set, a green light-emitting chip set, a yellow light-emitting chip set, and an amber light-emitting chip set. The wavelength-converting layer set is covered on the blue light-emitting chip set. The transparent layer sets are respectively covered on the red light-emitting chip set, the green light-emitting chip set, the yellow light-emitting chip set, and the amber light-emitting chip set.

Therefore, a part of visible light emitted by the blue light-emitting chip set is absorbed and converted into visible light with another emission peak wavelength range via the wavelength-converting layer set, and the visible light with another emission peak wavelength range mixes with projecting light projected from the red, the green, the yellow and the amber light-emitting chip sets to make the array type light-emitting device generate white light with a color rendering index of between 90 and 96.

Moreover, with regard to the composition of the array type light-emitting device, the present invention includes two types of composition of the array type light-emitting device, as follows:

1. First type: The blue light-emitting chip set is composed of eight blue LED chips, the red light-emitting chip set is composed of two red LED chips, the green light-emitting chip set is composed of four green LED chips, the yellow light-emitting chip set is one yellow LED chip, and the amber light-emitting chip set is one amber LED chip.

2. Second type: The blue light-emitting chip set is composed of eight blue LED chips, the red light-emitting chip set is one red LED chip, the green light-emitting chip set is composed of four green LED chips, the yellow light-emitting chip set is one yellow LED chip, and the amber light-emitting chip set is composed of two amber LED chips.

Furthermore, the present invention includes four types of wavelength-converting layer set, as follows:

1. First type: The wavelength-converting layer set is a mixture of yellow phosphor powders and a package colloid, and light projected from the blue light-emitting chip set is absorbed and converted into projected light with a color temperature range between 2800K and 10000K via the wavelength-converting layer set.

2. Second type: The wavelength-converting layer set is a mixture of orange and green phosphor powders and a package colloid, and light projected from the blue light-emitting chip set is absorbed and converted into projected light with a color temperature range between 2800K and 10000K via the wavelength-converting layer set.

3. Third type: The wavelength-converting layer set is composed of a plurality of first and second wavelength-converting layers, the first wavelength-converting layers are mixtures of yellow phosphor powders and a package colloid, and light projected from the blue light-emitting chip set is absorbed and converted into projected light with a color temperature range between 2800K and 10000K via the first wavelength-converting layers. The second wavelength-converting layers are mixtures of green phosphor powders and a package colloid, and light projected from the blue light-emitting chip set is absorbed and converted into projected light with an emission peak wavelength range between 480 nm and 495 nm via the second wavelength-converting layers.

4. Fourth type: The wavelength-converting layer set is composed of a plurality of first and second wavelength-converting layers, the first wavelength-converting layers are mixtures of orange and green phosphor powders and a package colloid, and light projected from the blue light-emitting chip set is absorbed and converted into projected light with a color temperature range between 2800K and 10000K via the first wavelength-converting layers. The second wavelength-converting layers are mixtures of green phosphor powders and a package colloid, and light projected from the blue light-emitting chip set is absorbed and converted into projected light with an emission peak wavelength range between 480 nm and 495 nm via the second wavelength-converting layers.

Therefore, the feature of the present invention is that the array type light-emitting module is composed of the blue light-emitting chip set, the red light-emitting chip set, the green light-emitting chip set, the yellow light-emitting chip set, and the amber light-emitting chip set, and then the wavelength-converting layer set is covered on the blue light-emitting chip set, the transparent layer sets are respectively covered on the red light-emitting chip set, the green light-emitting chip set, the yellow light-emitting chip set, and the amber light-emitting chip set. Therefore, the array type light-emitting device generates mixed white light with the color rendering index of between 90 and 96.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIG. 5A is a schematic view of an arrangement of an array type light-emitting device with high color rendering index according to the first embodiment of the present invention;

FIG. 6A is a schematic view of an arrangement of an array type light-emitting device with high color rendering index according to the second embodiment of the present invention;

FIG. 7A is a schematic view of an arrangement of an array type light-emitting device with high color rendering index according to the third embodiment of the present invention;

DETAILED DESCRIPTION OF THE PREFERRED EMBODIMENTS

Figure 1:
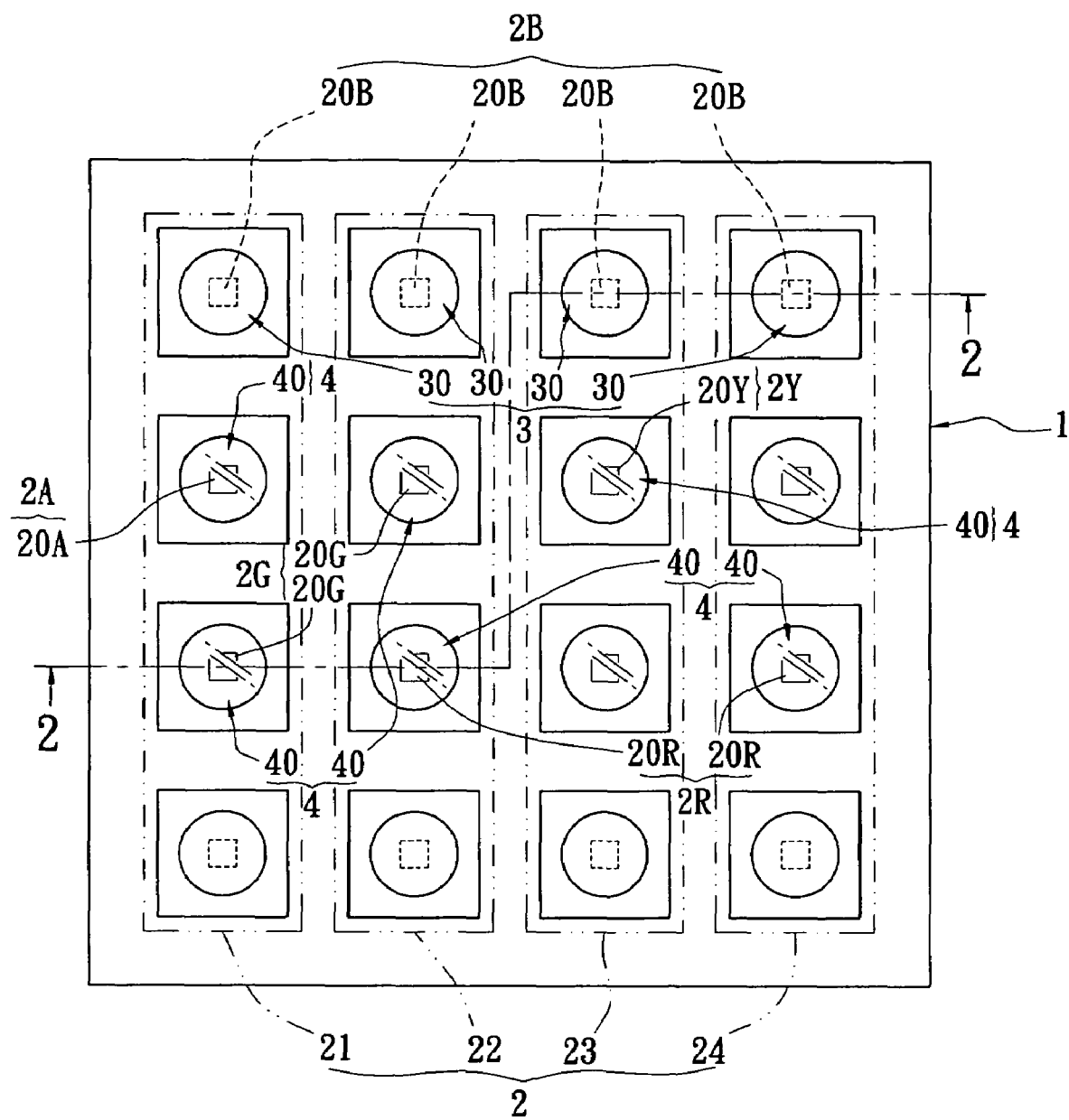
FIG. 1 is a top view of an array type light-emitting device with high color rendering index using one type of wavelength-converting layer according to the present invention.
Figure 2:
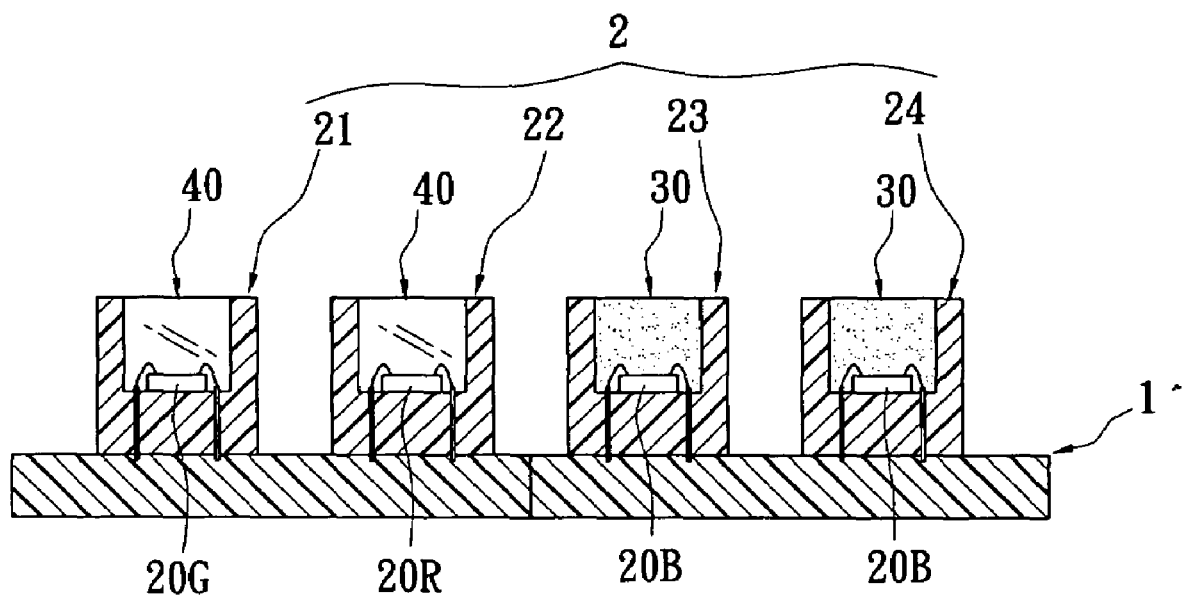
FIG. 2 is a cross-sectional view along line 2-2 in FIG. 1.

Referring to FIGS. 1-2, FIG. 1 shows a top view of an array type light-emitting device with high color rendering index using one type of wavelength-converting layer according to the present invention, and FIG. 2 shows a cross-sectional view along line 2-2 in FIG. 1. The present invention provides an array type light-emitting device with high color rendering index, including: a substrate 1, an array type light-emitting module 2, a wavelength-converting layer set 3, and a plurality of transparent layer sets 4.

Moreover, the array type light-emitting module 2 is electrically disposed on the substrate 1. The array type light-emitting module 2 is composed of a blue light-emitting chip set 2B, a red light-emitting chip set 2R, a green light-emitting chip set 2G, a yellow light-emitting chip set 2Y, and an amber light-emitting chip set 2A.

Furthermore, the blue light-emitting chip set 2B has an emission wavelength range between 450 nm and 460 nm, the red light-emitting chip set 2R has an emission wavelength range between 620 nm and 630 nm, the green light-emitting chip set 2G has an emission wavelength range between 520 nm and 540 nm, the yellow light-emitting chip set 2Y has an emission wavelength range between 585 nm and 595 nm, and the amber light-emitting chip set 2A has an emission wavelength range between 600 nm and 610 nm.

In addition, the blue light-emitting chip set 2B can be one blue LED chip or more than one blue LED chips 20B, the red light-emitting chip set 2R can be one red LED chip or more than one red LED chips 20R, the green light-emitting chip set 2G can be one green LED chip or more than one green LED chips 20G, the yellow light-emitting chip set 2Y can be one yellow LED chip or more than one yellow LED chips 20Y, and the amber light-emitting chip set 2A can be one amber LED chip or more than one amber LED chips 20A.

For example, In FIG. 1 the array type light-emitting module 2 is composed of a first light-emitting chip row 21, a second light-emitting chip row 22, a third light-emitting chip row 23 and a fourth light-emitting chip row 24. Each light-emitting chip row has four LED chips. Four blue LED chips 20B are respectively arranged at four first positions of light-emitting chip row (21, 22, 23, 24). Two red LED chips 20R are respectively arranged at two third positions of the second light-emitting chip row 22 and the fourth light-emitting chip row 24. Two green LED chips 20G are respectively arranged at a third position of the first light-emitting chip row 21 and a second position of the second light-emitting chip row 22. A yellow LED chip 20Y is arranged at a second position of the third light-emitting chip row 23. An amber LED chip 20A is arranged at a second position of the first light-emitting chip row 21. In addition, the LED chips (20R, 20G, 20Y, 20A) are separated from each other by a predetermined distance.

Moreover, the wavelength-converting layer set 3 is covered on the blue light-emitting chip set 2B. According to different needs, the wavelength-converting layer set 3 has two following choices:

(1) The wavelength-converting layer set 3 is a mixture of yellow phosphor powders and a package colloid, and light projected from the blue light-emitting chip set 2B is absorbed and converted into projected light with a color temperature range between 2800K and 10000K via the wavelength-converting layer set 3. Referring to FIG. 1 again, the wavelength-converting layer set 3 is composed of a plurality of wavelength-converting layers 30, and the wavelength-converting layers 30 are respectively covered on the blue LED chips 20B. In addition, the yellow phosphor powders can be replaced by orange and green phosphor powders.

Figure 3:
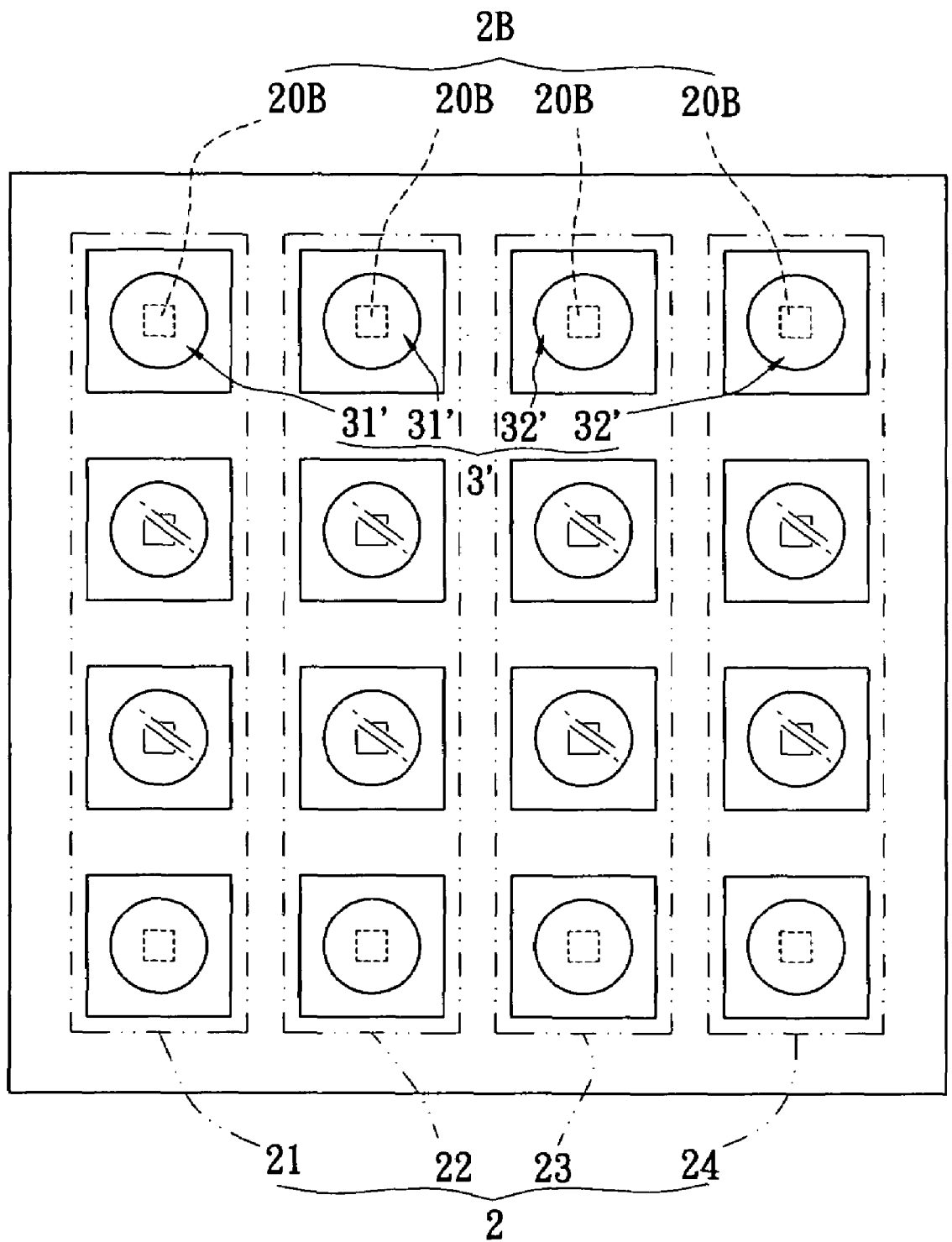
FIG. 3 is a top view of an array type light-emitting device with high color rendering index using two types of wavelength-converting layers according to the present invention.

(2) Referring to FIG. 3, the wavelength-converting layer set 3' is composed of a plurality of first wavelength-converting layers 31' and second wavelength-converting layers 32'. The first wavelength-converting layers 31' are mixtures of yellow phosphor powders and a package colloid, and light projected from the blue light-emitting chip set 2B is absorbed and converted into projected light with a color temperature range between 2800K and 10000K via the first wavelength-converting layers 31'. The second wavelength-converting layers 32' are mixtures of green phosphor powders and a package colloid, and light projected from the blue light-emitting chip set 2B is absorbed and converted into projected light with an emission peak wavelength range between 480 nm and 495 nm via the second wavelength-converting layers 32'. In addition, the yellow phosphor powders can be replaced by orange and green phosphor powders.

Moreover, each transparent layer set 4 corresponds to each light-emitting chip set (2R, 2G, 2Y or 2A). The transparent layer sets 4 are respectively covered on the red light-emitting chip set 2R, the green light-emitting chip set 2G, the yellow light-emitting chip set 2Y, and the amber light-emitting chip set 2A. In addition, the transparent layer sets 4 has a plurality of transparent layer 40 respectively covered on the LED chips (20R, 20G, 20Y or 20A) of the light-emitting chip sets (2R, 2G, 2Y or 2A).

Therefore, a part of visible light emitted by the blue light-emitting chip set 2B is absorbed and converted into visible light with another emission peak wavelength range via the wavelength-converting layer set 3, and the visible light with another emission peak wavelength range mixes with projecting light projected from the red, the green, the yellow and the amber light-emitting chip sets (2R, 2G, 2Y, 2A) to make the array type light-emitting device generate white light with a color rendering index of between 90 and 96.

Figure 4:
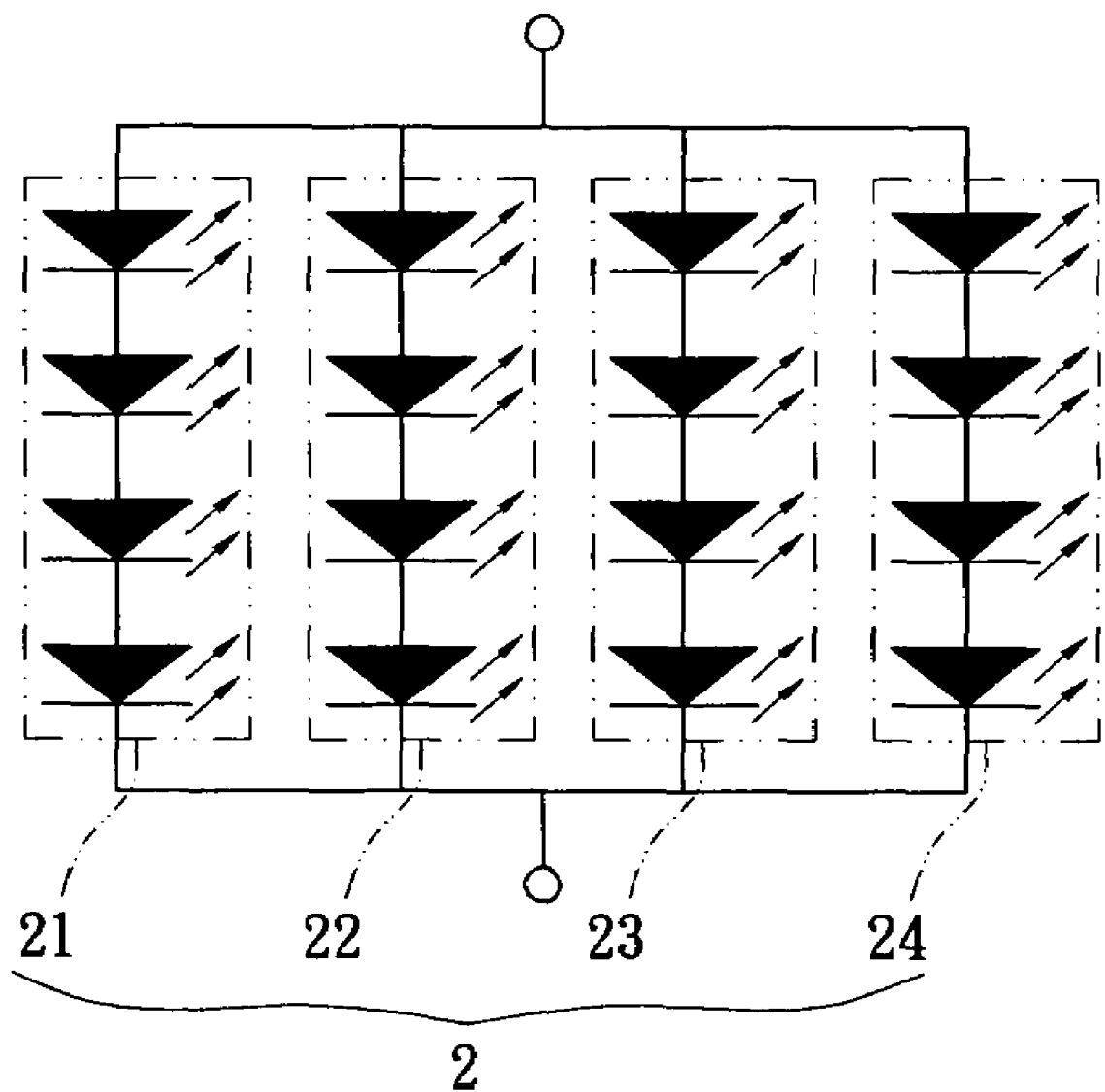
FIG. 4 is a schematic, circuit diagram of an array type light-emitting device with high color rendering index according to the present invention.

FIG. 4 shows a schematic, circuit diagram of an array type light-emitting device with high color rendering index according to the present invention. Referring to FIGS. 1 and 4, the array type light-emitting module 2 is composed of the four light-emitting chip rows (21, 22, 23, 24). Each light-emitting chip row has at least two blue LED chips 20B and at least two LED chips selected from the group consisting of the LED chips (20R, 20G, 20Y, 20A) of the red light-emitting chip set 2R, the green light-emitting chip set 2G, the yellow light-emitting chip set 2Y and the amber light-emitting chip set 2A to form a 4×4 array light-emitting module.

Furthermore, the light-emitting chip rows (21, 22, 23, 24) are electrically connected in parallel disposed on the substrate 1. The LED chips (20B, 20R, 20G, 20Y or 20A) of each light-emitting chip row (21, 22, 23 or 24) are electrically connected in series disposed on the substrate 1.

In addition, each blue LED chip 20B and each green LED chip 20G have a voltage rating between 2.9 V and 4.0 V. Each red LED chip 20R, each yellow LED chip 20Y and each amber LED chip 20A have a voltage rating between 1.8 V and 2.8 V. According to different needs, the designer can choose any LED chips (20B, 20R, 20G, 20Y, 20A) with different voltages to make a total voltage of each light-emitting chip row (21, 22, 23 or 24) be approximately 12 V. In the best mode embodiment of the present the total voltage of each light-emitting chip row (21, 22, 23 or 24) is 12 V.

Figure 5B:
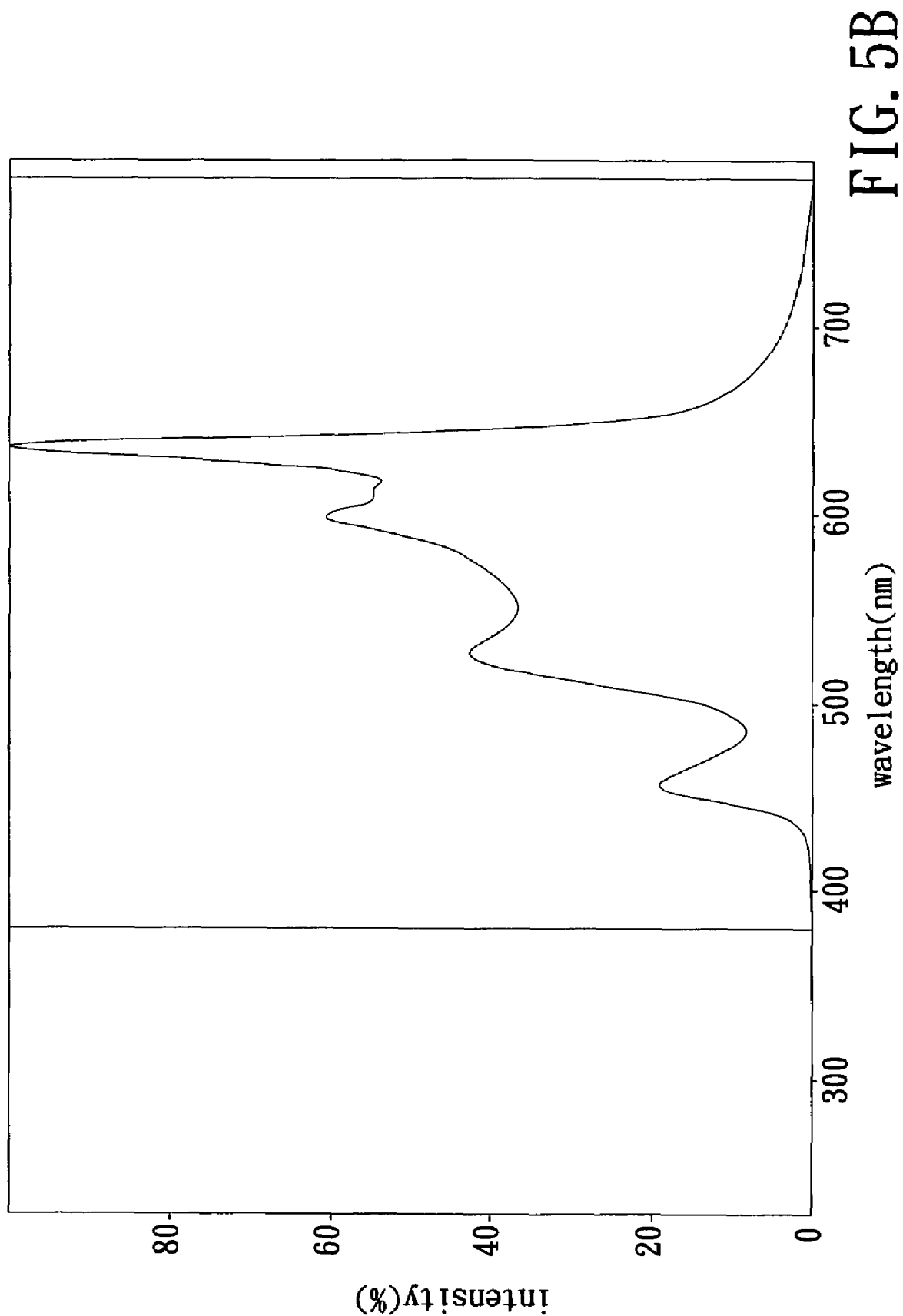
FIG. 5B is a spectrogram of an array type light-emitting device with high color rendering index according to the first embodiment of the present invention.

Referring to FIGS. 5A and 5B, FIG. 5A shows a schematic view of an arrangement of an array type light-emitting device with high color rendering index according to the first embodiment of the present invention, and FIG. 5B shows a spectrogram of an array type light-emitting device with high color rendering index according to the first embodiment of the present invention. The description of the first embodiment is as follows:

The area of B+P(OG) means that each blue LED chip B mates with a mixture P(OG) of orange and green phosphor powders and a package colloid, and a part of visible light emitted by each blue LED chip B is absorbed and converted into a white projecting light source with a color temperature range between 2800K and 10000K via the mixture P(OG);

The area of R means that each red LED chip R directly passes through a transparent layer (not shown) to generate a red projecting light source with an emission wavelength range between 620 nm and 630 nm;

The area of G means that each green LED chip G directly passes through a transparent layer (not shown) to generate a green projecting light source with an emission wavelength range between 520 nm and 540 nm;

The area of Y means that each yellow LED chip Y directly passes through a transparent layer (not shown) to generate a yellow projecting light source with an emission wavelength range between 585 nm and 595 nm; and The area of A means that each amber LED chip A directly passes through a transparent layer (not shown) to generate an amber projecting light source with an emission wavelength range between 600 nm and 610 nm.

Moreover, the arrangement of the first embodiment is same to that of FIG. 1.

Therefore, a part of visible light emitted by the blue LED chips B is absorbed and converted into the white projecting light source with the color temperature range between 2800K and 10000K via the wavelength-converting layer (the mixture P(OG) of orange and green phosphor powders and a package colloid).

Furthermore, the white projecting light source with the color temperature range between 2800K and 10000K and projecting light projected from the red, the green, the yellow and the amber light-emitting chip sets (R, G, Y, A) are mixed each other to make the array type light-emitting device of the first embodiment generate white light with a high color rendering index (CRI) of 92 and a color temperature range between 2500K and 4000K as shown in FIG. 5B.

Figure 6B:
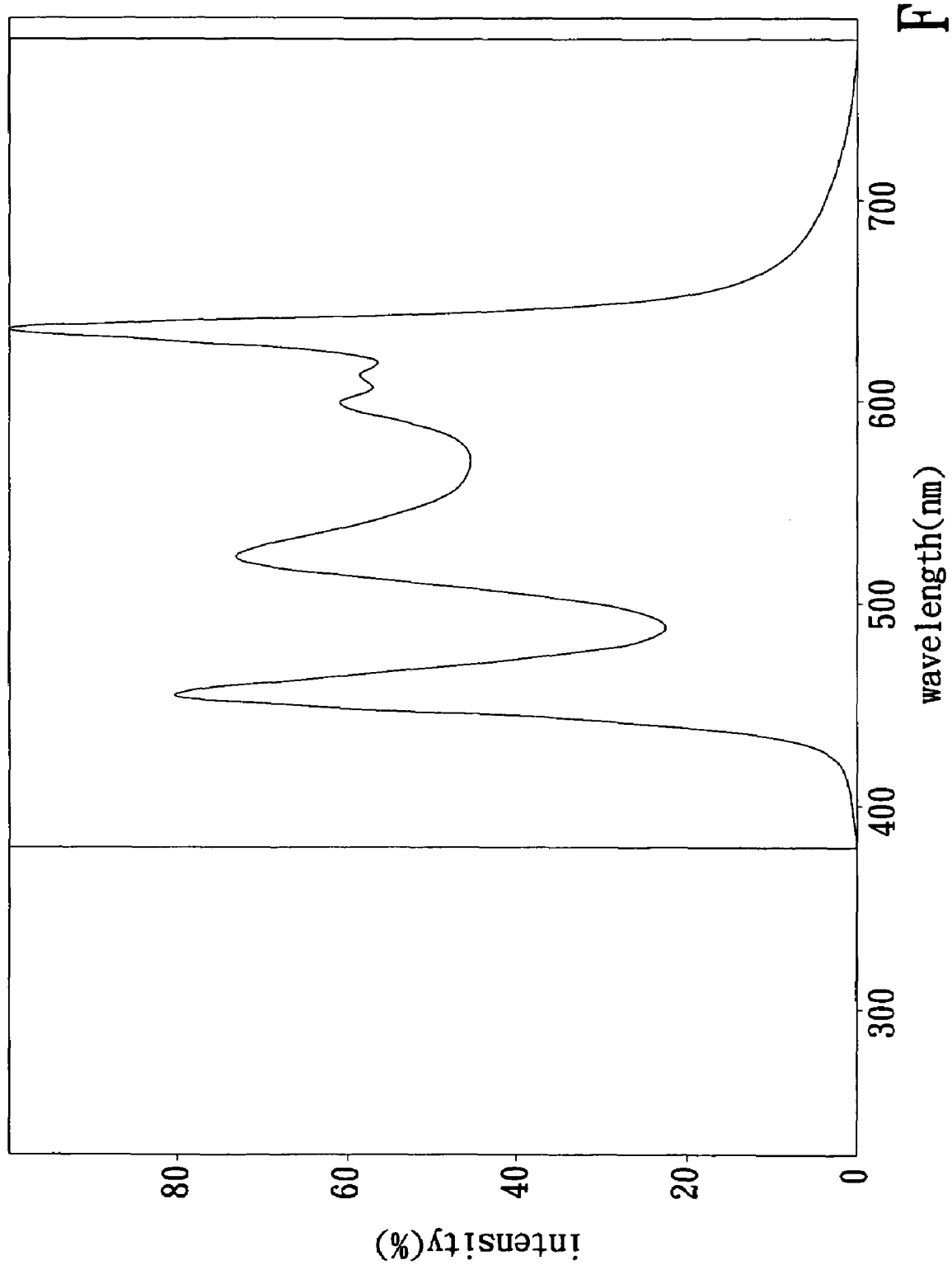
FIG. 6B is a spectrogram of an array type light-emitting device with high color rendering index according to the second embodiment of the present invention.

Referring to FIGS. 6A and 6B, FIG. 6A shows a schematic view of an arrangement of an array type light-emitting device with high color rendering index according to the second embodiment of the present invention, and FIG. 6B shows a spectrogram of an array type light-emitting device with high color rendering index according to the second embodiment of the present invention. The description of the second embodiment is as follows:

The area of B+P(OG) means that each blue LED chip B mates with a mixture P(OG) of orange and green phosphor powders and a package colloid, and a part of visible light emitted by each blue LED chip B is absorbed and converted into a white projecting light source with a color temperature range between 2800K and 10000K via the mixture P(OG);

The area of B+P(G) means that each blue LED chip B mates with a mixture P(G) of green phosphor powders and a package colloid, and a part of visible light emitted by each blue LED chip B is absorbed and converted into a green projecting light source with an emission wavelength range between 480 nm and 495 nm via the mixture P(G);

The area of R means that each red LED chip R directly passes through a transparent layer (not shown) to generate a red projecting light source with an emission wavelength range between 620 nm and 630 nm;

The area of G means that each green LED chip G directly passes through a transparent layer (not shown) to generate a green projecting light source with an emission wavelength range between 520 nm and 540 nm;

The area of Y means that each yellow LED chip Y directly passes through a transparent layer (not shown) to generate a yellow projecting light source with an emission wavelength range between 585 nm and 595 nm; and The area of A means that each amber LED chip A directly passes through a transparent layer (not shown) to generate an amber projecting light source with an emission wavelength range between 600 nm and 610 nm.

Moreover, with regard to the composition of the second embodiment, the blue light-emitting chip set is composed of eight blue LED chips B, the red light-emitting chip set is composed of two red LED chips R, the green light-emitting chip set is composed of four green LED chips G, the yellow light-emitting chip set is one yellow LED chip Y, and the amber light-emitting chip set is one amber LED chip A.

Furthermore, with regard to the arrangement of the second embodiment, the first light-emitting chip row is composed of two blue LED chips B, one green LED chip G and one amber LED chip A, the second light-emitting chip row is composed of two blue LED chips B, one green LED chip G and one red LED chip R, the third light-emitting chip row is composed of two blue LED chips B, one green LED chip G and one yellow LED chip Y, and fourth light-emitting chip row is composed of two blue LED chips B, one green LED chip G and one red LED chip R.

Therefore, one part of light projected from the blue light-emitting chips B is absorbed and converted into a white projecting light source with a color temperature range between 2800K and 10000K via the first wavelength-converting layers (the mixture P(OG) of orange and green phosphor powders and a package colloid), and the other part of light projected from the blue light-emitting chips B is absorbed and converted into a green projecting light source with an emission peak wavelength range between 480 nm and 495 nm via the second wavelength-converting layers (the mixture P(G) of green phosphor powders and a package colloid).

Furthermore, the white projecting light source with the color temperature range between 2800K and 10000K, the green projecting light source with the emission peak wavelength range between 480 nm and 495 nm, and projecting light projected from the red, the green, the yellow and the amber light-emitting chip sets (R, G, Y, A) are mixed each other to make the array type light-emitting device of the second embodiment generate white light with a high color rendering index (CRI) of 96 and a color temperature range between 4000K and 6000K as shown in FIG. 6B.

Figure 7B:
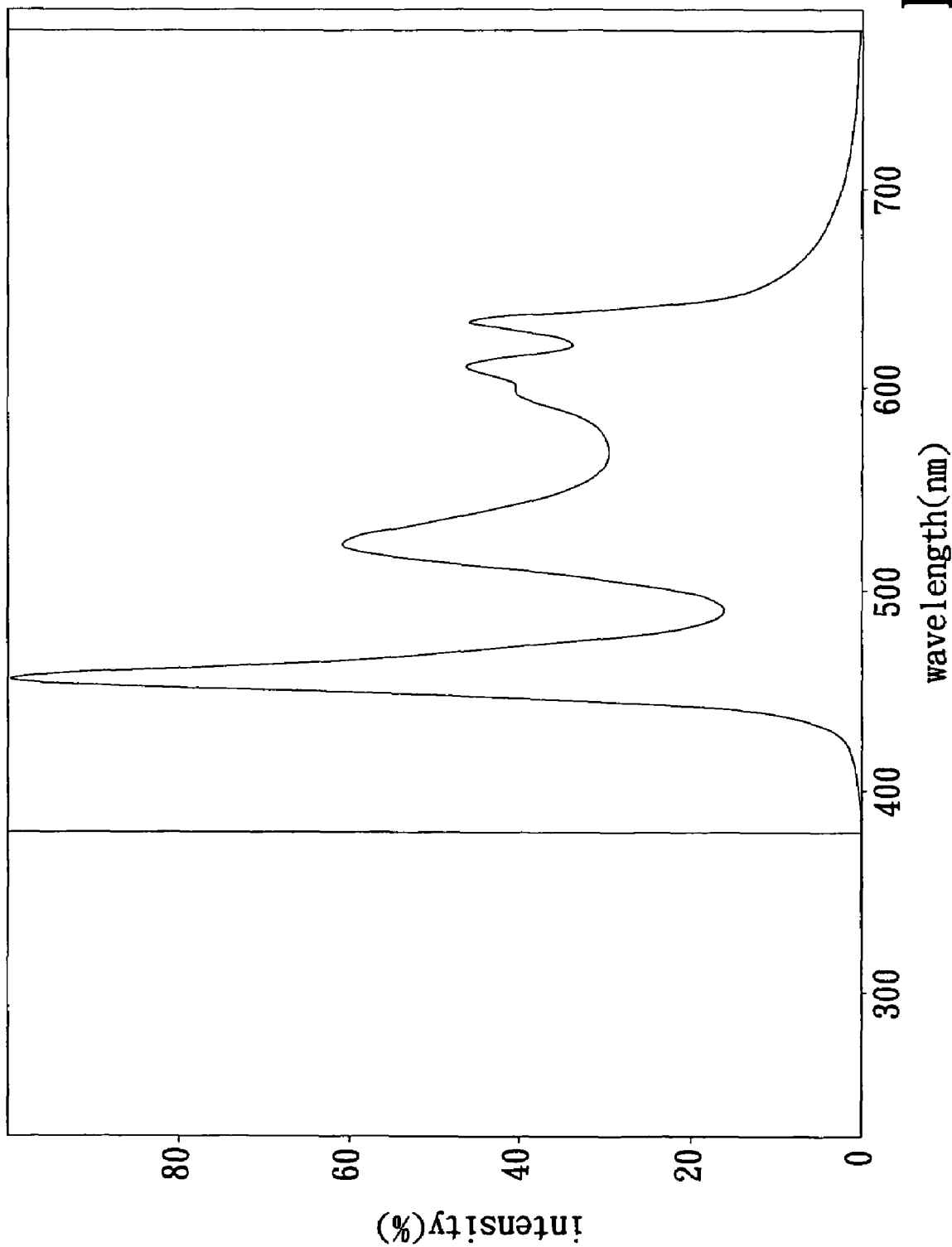
FIG. 7B is a spectrogram of an array type light-emitting device with high color rendering index according to the third embodiment of the present invention.

Referring to FIGS. 7A and 7B, FIG. 7A shows a schematic view of an arrangement of an array type light-emitting device with high color rendering index according to the third embodiment of the present invention, and FIG. 7B shows a spectrogram of an array type light-emitting device with high color rendering index according to the third embodiment of the present invention. The description of the second embodiment is as follows:

The area of B+P(OG) means that each blue LED chip B mates with a mixture P(OG) of orange and green phosphor powders and a package colloid, and a part of visible light emitted by each blue LED chip B is absorbed and converted into a white projecting light source with a color temperature range between 2800K and 10000K via the mixture P(OG);

The area of R means that each red LED chip R directly passes through a transparent layer (not shown) to generate a red projecting light source with an emission wavelength range between 620 nm and 630 nm;

The area of G means that each green LED chip G directly passes through a transparent layer (not shown) to generate a green projecting light source with an emission wavelength range between 520 nm and 540 nm;

The area of Y means that each yellow LED chip Y directly passes through a transparent layer (not shown) to generate a yellow projecting light source with an emission wavelength range between 585 nm and 595 nm; and The area of A means that each amber LED chip A directly passes through a transparent layer (not shown) to generate an amber projecting light source with an emission wavelength range between 600 nm and 610 nm.

Moreover, with regard to the composition of the third embodiment, the blue light-emitting chip set is composed of eight blue LED chips B, the red light-emitting chip set is one red LED chip R, the green light-emitting chip set is composed of four green LED chips G, the yellow light-emitting chip set is one yellow LED chip Y, and the amber light-emitting chip set is composed of two amber LED chips A.

Furthermore, with regard to the arrangement of the third embodiment, the first light-emitting chip row is composed of two blue LED chips B, one green LED chip G and one amber LED chip A, the second light-emitting chip row is composed of two blue LED chips B, one green LED chip G and one red LED chip R, the third light-emitting chip row is composed of two blue LED chips B, one green LED chip G and one yellow LED chip Y, and fourth light-emitting chip row is composed of two blue LED chips B, one green LED chip G and one amber LED chip A.

Therefore, light projected from the blue light-emitting chips B is absorbed and converted into a white projecting light source with a color temperature range between 2800K and 10000K via the first wavelength-converting layers (the mixture P(OG) of orange and green phosphor powders and a package colloid).

Furthermore, the white projecting light source with the color temperature range between 2800K and 10000K and projecting light projected from the red, the green, the yellow and the amber light-emitting chip sets (R, G, Y, A) are mixed each other to make the array type light-emitting device of the second embodiment generate white light with a high color rendering index (CRI) of 95.5 and a color temperature range between 6000K and 9000K as shown in FIG. 7B.

In conclusion, the feature of the present invention is that the array type light-emitting module 2 is composed of the blue light-emitting chip set 2B, the red light-emitting chip set 2R, the green light-emitting chip set 2G, the yellow light-emitting chip set 2Y, and the amber light-emitting chip set 2A, and then the wavelength-converting layer set 3 or 3' is covered on the blue light-emitting chip set 2B, the transparent layer sets 4 are respectively covered on the red light-emitting chip set 2R, the green light-emitting chip set 2G, the yellow light-emitting chip set 2Y, and the amber light-emitting chip set 2A. Therefore, the array type light-emitting device generates mixed white light with the color rendering index of between 90 and 96.

Figure 8:
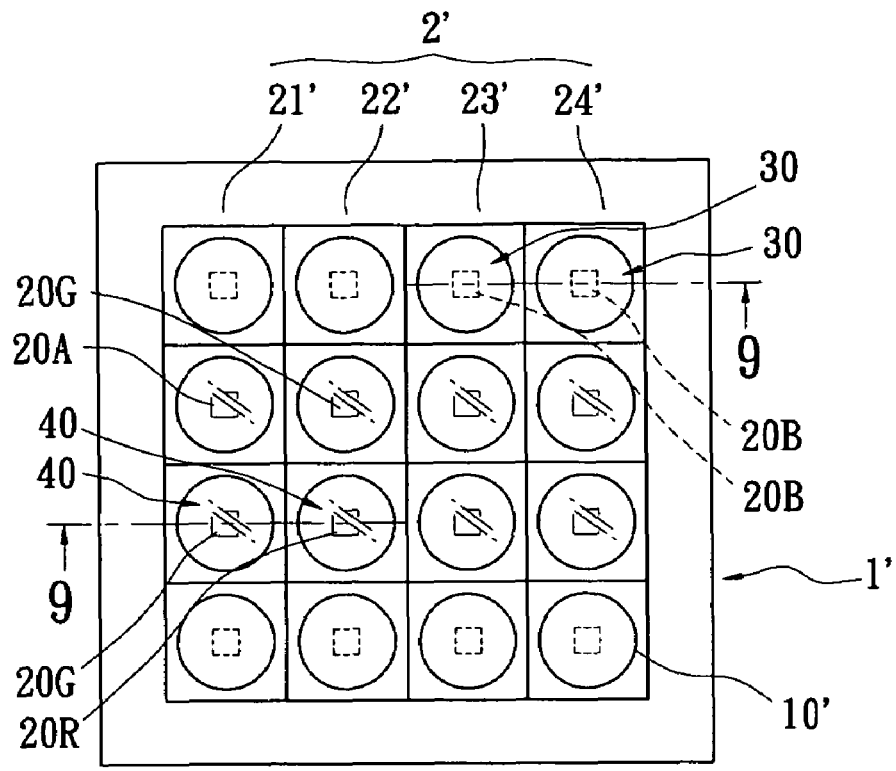
FIG. 8 is a top view of another type of an array type light-emitting device with high color rendering index according to the present invention.
Figure 9:
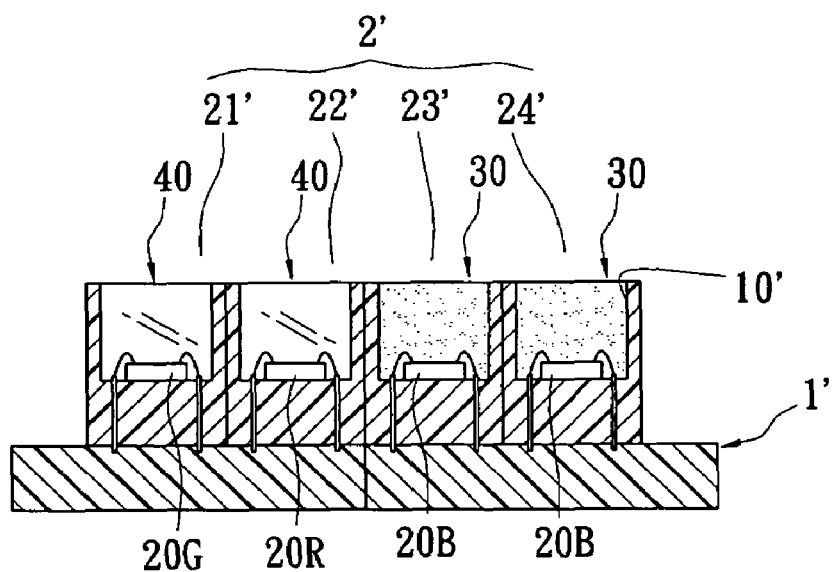
FIG. 9 is a cross-sectional view along line 9-9 in FIG. 8.

Referring to FIGS. 8 and 9, FIG. 8 shows a top view of another type of an array type light-emitting device with high color rendering index according to the present invention, and FIG. 9 shows a cross-sectional view along line 9-9 in FIG. 8. The difference between the type of the array type light-emitting device and the above-mentioned array type light-emitting device is that a substrate 1' has a plurality of receiving grooves 10' abutting against each other, and the LED chips (20R, 20G, 20Y, 20A) of the light-emitting chip rows (21', 22', 23', 24') of an array type light-emitting module 2' are respectively received in the receiving grooves 10'.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An array type light-emitting device with high color rendering index, comprising:
    a substrate;
    an array type light-emitting module electrically disposed on the substrate, wherein the array type light-emitting module is composed of a blue light-emitting chip set, a red light-emitting chip set, a green light-emitting chip set, a yellow light-emitting chip set, and an amber light-emitting chip set, wherein said blue light-emitting chip set includes eight blue LED chips arranged in a pair of spaced apart outer-most blue light-emitting chip rows, wherein four of the eight blue LED chips are arranged to form one of said pair of the outer-most light-emitting chip rows, and other four of the eight blue LED chips are arranged to form another of said pair of the outer-most light-emitting chip rows, and wherein said red, green, yellow, and amber light-emitting chip sets are disposed between said outer-most blue light-emitting chip rows;

a wavelength-converting layer set covered on the blue light-emitting chip set; and a plurality of transparent layer sets respectively covered on the red light-emitting chip set, the green light-emitting chip set, the yellow light-emitting chip set, and the amber light-emitting chip set, other than blue light-emitting chip set;

whereby, a part of visible light emitted by the blue light-emitting chip set is absorbed and converted into visible light with another emission peak wavelength range via the wavelength-converting layer set, and the visible light with another emission peak wavelength range mixes with projecting light projected from the red, the green, the yellow and the amber light-emitting chip sets to make the array type light-emitting device generate white light with a color rendering index of between 90 and 96.

2. The array type light-emitting device as claimed in claim 1, wherein the blue light-emitting chip set has an emission wavelength range between 450 nm and 460 nm, the red light-emitting chip set has an emission wavelength range between 620 nm and 630 nm, the green light-emitting chip set has an emission wavelength range between 520 nm and 540 nm, the yellow light-emitting chip set has an emission wavelength range between 585 nm and 595 nm, and the amber light-emitting chip set has an emission wavelength range between 600 nm and 610 nm.

3. The array type light-emitting device as claimed in claim 1, wherein the wavelength-converting layer set is a mixture of yellow phosphor powders and a package colloid, and light projected from the blue light-emitting chip set is absorbed and converted into projected light with a color temperature range between 2800K and 10000K via the wavelength-converting layer set.

4. The array type light-emitting device as claimed in claim 1, wherein the wavelength-converting layer set is a mixture of orange and green phosphor powders and a package colloid, and light projected from the blue light-emitting chip set is absorbed and converted into projected light with a color temperature range between 2800K and 10000K via the wavelength-converting layer set.

5. The array type light-emitting device as claimed in claim 1, wherein the wavelength-converting layer set is composed of a plurality of first and second wavelength-converting layers, the first wavelength-converting layers are mixtures of yellow phosphor powders and a package colloid, and light projected from the blue light-emitting chip set is absorbed and converted into projected light with a color temperature range between 2800K and 10000K via the first wavelength-converting layers; wherein the second wavelength-converting layers are mixtures of green phosphor powders and a package colloid, and light projected from the blue light-emitting chip set is absorbed and converted into projected light with an emission peak wavelength range between 480 nm and 495 nm via the second wavelength-converting layers.

6. The array type light-emitting device as claimed in claim 1, wherein the wavelength-converting layer set is composed of a plurality of first and second wavelength-converting layers, the first wavelength-converting layers are mixtures of orange and green phosphor powders and a package colloid, and light projected from the blue light-emitting chip set is absorbed and converted into projected light with a color temperature range between 2800K and 10000K via the first wavelength-converting layers; wherein the second wavelength-converting layers are mixtures of green phosphor powders and a package colloid, and light projected from the blue light-emitting chip set is absorbed and converted into projected light with an emission peak wavelength range between 480 nm and 495 nm via the second wavelength-converting layers.

7. The array type light-emitting device as claimed in claim 1, wherein the red light-emitting chip set includes one red LED chip, the green light-emitting chip set is composed of four green LED chips, the yellow light-emitting chip set includes one yellow LED chip, and the amber light-emitting chip set is composed of two amber LED chips; and wherein each blue LED chip and each green LED chip has a voltage ranging between 2.9 V and 4.0 V, and each of the red LED chip, the yellow LED chip and each amber LED chip has a voltage ranging between 1.8 V and 2.8 V.

8. The array type light-emitting device as claimed in claim 1, wherein between said two outer-most rows of said blue LED chips, said red, green, yellow, and amber light-emitting chip sets are arranged in two rows, each of said two rows including at least two LED chips selected from the group consisting of the LED chips of the red light-emitting chip set, the green light-emitting chip set, the yellow light-emitting chip set and the amber light-emitting chip set, thereby forming a 4×4 array light-emitting module; wherein a total voltage of each light-emitting chip row is 12 V.

9. The array type light-emitting device as claimed in claim 8, wherein the LED chips are separated from each other by a predetermined distance.

10. The array type light-emitting device as claimed in claim 8, wherein the substrate has a plurality of receiving grooves abutting against each other, and the LED chips are respectively received in the receiving grooves.

11. An array type light-emitting device with high color rendering index, comprising:

a substrate;

an array type light-emitting module electrically disposed on the substrate, wherein the array type light-emitting module is composed of a blue light-emitting chip set having eight blue LED chips, a red light-emitting chip set having two red LED chips, a green light-emitting chip set having four green LED chips, a yellow light-emitting chip set having a yellow LED chip, and an amber light-emitting chip set having an amber LED chip, wherein said blue light-emitting chip set includes eight blue LED chips arranged in a pair of spaced apart outer-most blue light-emitting chip rows, wherein four of the eight blue LED chips are arranged to form one of said pair of the outer-most light-emitting chip rows, and other four of the eight blue LED chips are arranged to form another of said pair of the outer-most light-emitting chip rows, and wherein said red, green, yellow, and amber light-emitting chip sets are disposed between said outer-most blue light-emitting chip rows;

a wavelength-converting layer set covered on the blue light-emitting chip set, wherein the wavelength-converting layer set is composed of a plurality of first and second wavelength-converting layers, the first wavelength-converting layers are mixtures of orange and green phosphor powders and a package colloid, and the second wavelength-converting layers are mixtures of green phosphor powders and a package colloid; and a plurality of transparent layer sets respectively covered on the red light-emitting chip set, the green light-emitting chip set, the yellow light-emitting chip set, and the amber light-emitting chip set, other than blue light-emitting chip set;

whereby, light projected from the blue light-emitting chip set is absorbed and converted into projected light with a color temperature range between 2800K and 10000K via the first wavelength-converting layers, light projected from the blue light-emitting chip set is absorbed and converted into projected light with an emission peak wavelength range between 480 nm and 495 nm via the second wavelength-converting layers; wherein the projected light passing through the wavelength-converting layer set mixes with projecting light projected from the red, the green, the yellow and the amber light-emitting chip sets to make the array type light-emitting device generate white light with a color rendering index of between 90 and 96.

12. The array type light-emitting device as claimed in claim 11, wherein the blue light-emitting chip set has an emission wavelength range between 450 nm and 460 nm, the red light-emitting chip set has an emission wavelength range between 620 nm and 630 nm, the green light-emitting chip set has an emission wavelength range between 520 nm and 540 nm, the yellow light-emitting chip set has an emission wavelength range between 585 nm and 595 nm, and the amber light-emitting chip set has an emission wavelength range between 600 nm and 610 nm.

13. The array type light-emitting device as claimed in claim 11, wherein said blue, red, green, yellow, and amber LED chips are arranged in a plurality of respective light-emitting chip rows, wherein each blue LED chip and each green LED chip has a voltage ranging between 2.9 V and 4.0 V, wherein each of the red LED chip, yellow LED chip, and amber LED chip has a voltage ranging between 1.8 V and 2.8 V; wherein a total voltage of each light-emitting chip row is 12 V; wherein the light-emitting chip rows are electrically connected in parallel, and wherein the LED chips in each respective light-emitting chip row are electrically connected in series.

14. The array type light-emitting device as claimed in claim 13, wherein the LED chips are separated from each other by a predetermined distance.

15. The array type light-emitting device as claimed in claim 13, wherein the substrate has a plurality of receiving grooves abutting against each other, and the LED chips are respectively received in the receiving grooves.

16. An array type light-emitting device with high color rendering index, comprising:

a substrate;

an array type light-emitting module electrically disposed on the substrate, wherein the array type light-emitting module is composed of a blue light-emitting chip set having eight blue LED chips, a red light-emitting chip set having two red LED chips, a green light-emitting chip set having four green LED chips, a yellow light-emitting chip set having a yellow LED chip, and an amber light-emitting chip set having an amber LED chip, wherein said blue light-emitting chip set includes eight blue LED chips arranged in a pair of spaced apart outer-most blue light-emitting chip rows, wherein four of the eight blue LED chips are arranged to form one of said pair of the outer-most light-emitting chip rows, and other four of the eight blue LED chips are arranged to form another of said pair of outer-most light-emitting chip rows, and wherein said red, green, yellow, and amber light-emitting chip sets are disposed between said outer-most blue light-emitting chip rows;

a wavelength-converting layer set covered on the blue light-emitting chip set, wherein the wavelength-converting layer set is a mixture of orange and green phosphor powders and a package colloid; and a plurality of transparent layer sets respectively covered on the red light-emitting chip set, the green light-emitting chip set, the yellow light-emitting chip set, and the amber light-emitting chip set, other than blue light-emitting chip set;

whereby, light projected from the blue light-emitting chip set is absorbed and converted into projected light with a color temperature range between 2800K and 10000K via the wavelength-converting layer set; wherein the projected light passing through the wavelength-converting layer set mixes with projecting light projected from the red, the green, the yellow and the amber light-emitting chip sets to make the array type light-emitting device generate white light with a color rendering index of between 90 and 96.

17. The array type light-emitting device as claimed in claim 16, wherein the blue light-emitting chip set has an emission wavelength range between 450 nm and 460 nm, the red light-emitting chip set has an emission wavelength range between 620 nm and 630 nm, the green light-emitting chip set has an emission wavelength range between 520 nm and 540 nm, the yellow light-emitting chip set has an emission wavelength range between 585 nm and 595 nm, and the amber light-emitting chip set has an emission wavelength range between 600 nm and 610 nm.

18. The array type light-emitting device as claimed in claim 16, wherein said blue, red, green, yellow, and amber LED chips are arranged in a plurality of respective light emitting chip rows, wherein each blue LED chip and each green LED chip has a voltage ranging between 2.9 V and 4.0 V, and wherein each of the red LED chip, the yellow LED chip, and amber LED chip has a voltage ranging between 1.8 V and 2.8 V; wherein a total voltage of each light-emitting chip row is 12 V; wherein the light-emitting chip rows are electrically connected in parallel, and wherein the LED chips in each respective light-emitting chip row are electrically connected in series.

19. The array type light-emitting device as claimed in claim 18, wherein the LED chips are separated from each other by a predetermined distance.

20. The array type light-emitting device as claimed in claim 18, wherein the substrate has a plurality of receiving grooves abutting against each other, and the LED chips are respectively received in the receiving grooves.

* * * * *